United States Patent
Nagano

(10) Patent No.: US 9,929,289 B2
(45) Date of Patent: Mar. 27, 2018

(54) SOLAR CELL, ELECTRONIC DEVICE, AND MANUFACTURING METHOD OF SOLAR CELL

(71) Applicant: SEIKO EPSON CORPORATION, Tokyo (JP)

(72) Inventor: Daisuke Nagano, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 202 days.

(21) Appl. No.: 14/813,694

(22) Filed: Jul. 30, 2015

(65) Prior Publication Data

US 2016/0043246 A1 Feb. 11, 2016

(30) Foreign Application Priority Data

Aug. 6, 2014 (JP) .................................. 2014-160182

(51) Int. Cl.
| | |
|---|---|
| *H01L 31/044* | (2014.01) |
| *H01L 31/0224* | (2006.01) |
| *H01L 31/02* | (2006.01) |
| *G04G 19/00* | (2006.01) |
| *G04C 10/02* | (2006.01) |
| *H01L 31/05* | (2014.01) |
| *H01L 31/0445* | (2014.01) |

(52) U.S. Cl.
CPC ...... *H01L 31/022466* (2013.01); *G04C 10/02* (2013.01); *G04G 19/00* (2013.01); *H01L 31/02013* (2013.01); *H01L 31/022425* (2013.01); *H01L 31/0445* (2014.12); *H01L 31/0512* (2013.01)

(58) Field of Classification Search
CPC ........ H01L 31/00–31/078; Y02E 10/50–10/60
USPC .................................................. 136/243–265
See application file for complete search history.

(56) References Cited

U.S. PATENT DOCUMENTS

| | | | | |
|---|---|---|---|---|
| 4,443,652 A | * | 4/1984 | Izu | ........................ H01L 31/076 136/244 |
| 2011/0203650 A1 | * | 8/2011 | Furusawa | .............. B82Y 20/00 136/255 |
| 2012/0118370 A1 | * | 5/2012 | Rhodes | ........... H01L 31/022425 136/256 |
| 2013/0048047 A1 | * | 2/2013 | Fujii | ................... H01L 31/0504 136/244 |
| 2013/0065355 A1 | * | 3/2013 | Liang | ................. H01L 31/0749 438/95 |

FOREIGN PATENT DOCUMENTS

| | | |
|---|---|---|
| JP | 2014-096532 A | 5/2014 |
| JP | 2015-060907 A | 3/2015 |
| WO | WO2013090607 | * 6/2013 |

* cited by examiner

*Primary Examiner* — Bach T Dinh
(74) *Attorney, Agent, or Firm* — Oliff PLC

(57) ABSTRACT

A conductive paste is disposed on a transparent conductive film of a substrate in which a power generating film and the transparent conductive film are disposed in this order, a wiring member is disposed on the conductive paste through an anisotropic conductive film, and the anisotropic conductive film is heated while pressing the substrate and the wiring member by interposing them, and thus the wiring member is fixed.

14 Claims, 8 Drawing Sheets

SOLAR CELL, ELECTRONIC DEVICE, AND MANUFACTURING METHOD OF SOLAR CELL

BACKGROUND

1. Technical Field

This application claims a priority to Japanese Patent Application No. 2014-160182 filed on Aug. 6, 2014 which is hereby expressly incorporated by reference in its entirety.

Several aspects of the present invention relate to a solar cell, an electronic device, and a manufacturing method of a solar cell.

2. Related Art

A structure of a silicon-based solar cell which has been widely used is disclosed in JP-A-2014-096532. According to this, as a photoelectric conversion element, a single crystal silicon type photoelectric conversion element or a multi-crystal photoelectric conversion element is used. Then, a finger electrode which is a silver film is disposed on a light receiving surface of the photoelectric conversion element, and the finger electrode and a tab line are adhered to each other through a conductive adhesive material. As the tab line, a copper foil or an aluminum foil is used. A back electrode is disposed on a surface on a side opposite to the light receiving surface of the photoelectric conversion element. The back electrode is an aluminum film or a silver film, and is disposed by a sputtering method or a screen printing method.

A solar cell disposed in a portable electronic device is required to be thin and have high power generation efficiency. Therefore, a structure is considered in which a power generating film and a transparent conductive film are disposed on a metal plate of stainless steel or the like in an overlapping manner, and wiring is disposed on the metal plate and the transparent conductive film. The power generating film has a structure in which the metal plate is a back electrode, a p+ type layer, a p type layer, and an n type layer are laminated on the metal plate, and the transparent conductive film is connected to the n type layer. Alternatively, the power generating film has a PIN junction type structure in which an intrinsic semiconductor is arranged between the p type layer and the n type layer. Accordingly, the power generating film has a structure of a pn junction type photodiode. Then, when the power generating film is irradiated with light, the power generating film is excited by the light, and thus electric current flows.

The wiring is disposed on the transparent conductive film through the anisotropic conductive film. When the wiring is disposed, the power generating film, the transparent conductive film, and the anisotropic conductive film are pressed and heated by being interposed between the wiring and the metal plate, and thus the anisotropic conductive film functions as an adhesive material. The anisotropic conductive film includes conductive particles. When the power generating film is pressed, stress is concentrated by the conductive particles, and thus the power generating film is damaged. Accordingly, electrostatic resistance decreases. Therefore, a solar cell having excellent electrostatic resistance has been demanded.

SUMMARY

An advantage of some aspects of the invention is to solve the problems described above, and the invention can be implemented as the following forms or application examples.

APPLICATION EXAMPLE 1

This application example is directed to a manufacturing method of a solar cell including disposing a conductive paste on a transparent conductive film of a substrate in which a power generating film and the transparent conductive film are disposed in this order, disposing a wiring member on the conductive paste through an anisotropic conductive film, and fixing the wiring member by heating the substrate and the wiring member while the substrate and the wiring member are pressed by being interposed.

In this application example, the power generating film and the transparent conductive film are disposed on the substrate in this order. Then, the conductive paste is disposed on the transparent conductive film. Further, the wiring member is disposed on the conductive paste through the anisotropic conductive film. Next, the substrate and the wiring member are pressed by being interposed. Then, the wiring member is fixed by being heated while being pressed. The anisotropic conductive film is a film in which conductive particles are mixed in an adhesive material film. The conductive paste is a paste in which the conductive particles are mixed in the adhesive material film. The conductive particles included in the conductive paste are fine particles compared to the conductive particles of the anisotropic conductive film.

The power generating film is a semiconductor film having a photovoltaic effect and is a film which is easily damaged by pressurization. Then, the damaged power generating film has low pressure resistance. Then, an electric current is leaked at a position which is damaged at the time of applying the electric voltage by static electricity, and thus insulation is broken. In this application example, the transparent conductive film, the conductive paste, and the anisotropic conductive film are arranged between the power generating film and the wiring member. When the substrate and the wiring member are pressed by being interposed, a distribution of a stress applied to the power generating film is averaged by the conductive paste. Thus, stress is prevented from being biased to a specific position. Accordingly, the stress is not concentrated on a specific position of the power generating film, and thus the power generating film is prevented from being damaged. As a result thereof, it is possible to improve the electrostatic resistance of the solar cell.

APPLICATION EXAMPLE 2

This application example is directed to the manufacturing method of a solar cell according to the application example described above, wherein the thickness of the conductive paste is greater than or equal to 5 μm.

In this application example, the thickness of the conductive paste is greater than or equal to 5 μm. When the thickness of the conductive paste is greater than or equal to 5 μm, the distribution of the stress applied to the power generating film at the time of pressing the substrate and the wiring member by interposing them is reliably averaged by the conductive paste. Then, it is possible to prevent the stress from being biased to a specific position.

APPLICATION EXAMPLE 3

This application example is directed to a solar cell including a substrate having conductivity, a power generating film which is disposed on the substrate and generates power by receiving light, a transparent conductive film which is disposed on the power generating film, and a wiring member which is connected to the transparent conductive film, in which the transparent conductive film and the wiring member are fixed by interposing the conductive paste and the anisotropic conductive film.

In this application example, the power generating film and the transparent conductive film are disposed on the substrate in the solar cell. It is possible to obtain the power which is generated by the power generating film receiving the light from the substrate and the transparent conductive film. The conductive paste and the anisotropic conductive film are disposed on the transparent conductive film, and the conductive paste and the anisotropic conductive film are members which allow the electricity of the transparent conductive film to flow. Then, the transparent conductive film and the wiring member are fixed by interposing the conductive paste and the anisotropic conductive film.

When the transparent conductive film and the wiring member are joined, the substrate and the wiring member are pressed by being interposed. Then, the anisotropic conductive film is heated while being pressed, and thus the wiring member is fixed. The distribution of the stress applied to the power generating film at the time of pressing the substrate and the wiring member by interposing them is averaged by the conductive paste. Then, the stress is prevented from being biased to a specific position. Accordingly, the stress is not concentrated on a specific position of the power generating film, and thus the power generating film is prevented from being damaged. As a result thereof, it is possible to improve the electrostatic resistance of the solar cell.

APPLICATION EXAMPLE 4

This application example is directed to the solar cell according to the application example described above, wherein the thickness of the conductive paste is greater than or equal to 5 μm.

In this application example, the thickness of the conductive paste is greater than or equal to 5 μm. When the thickness of the conductive paste is greater than or equal to 5 μm, the distribution of the stress applied to the power generating film at the time of pressing the substrate and the wiring member by interposing them is reliably averaged by the conductive paste. Then, it is possible to prevent the stress from being biased to a specific position.

APPLICATION EXAMPLE 5

This application example is directed to the solar cell according to the application example described above, wherein the conductive paste is a paste including carbon particles.

In this application example, the conductive paste includes the carbon particles. The carbon particles are easily-available subject matter, and are able to be easily obtained. Accordingly, it is possible to easily dispose the conductive paste.

APPLICATION EXAMPLE 6

This application example is directed to the solar cell according to the application example described above, which includes a plurality of the substrates in which the wiring member is fixed to the transparent conductive film, wherein the transparent conductive film and the wiring member are fixed by interposing the conductive paste and the anisotropic conductive film in each of the substrates.

In this application example, the solar cell includes the plurality of substrates in which the wiring member is fixed to the transparent conductive film. When the respective substrates are connected in series, it is possible to increase an output electric voltage. When the respective substrates are connected in parallel, it is possible to increase an output electric current. Then, in each of the substrates, the transparent conductive film and the wiring member are fixed by interposing the conductive paste and the anisotropic conductive film. Accordingly, each of the substrates and the power generating film are prevented from being damaged. As a result thereof, it is possible to improve the electrostatic resistance of the solar cell including the plurality of substrates.

APPLICATION EXAMPLE 7

This application example is directed to an electronic device including a solar cell, in which the solar cell includes a substrate having conductivity, power generating film which is disposed on the substrate and generates power by receiving light, a transparent conductive film which is disposed on the power generating film, and a wiring member which is connected to the transparent conductive film, in which the transparent conductive film and the wiring member are fixed by interposing the conductive paste and the anisotropic conductive film.

In this application example, the electronic device includes the solar cell. The solar cell is a solar cell of which the electrostatic resistance is improved. Accordingly, the electronic device may be an electronic device including the solar cell of which the electrostatic resistance is improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

In this embodiment, discriminative examples of a solar cell and a manufacturing method of a solar cell will be described with reference to the drawings. Furthermore, each member in each drawing is a recognizable size, and thus the scale size is different for each member. In addition, the shape of each member or the like is determined for the sake of simplicity in order to easily describe the gist of the invention, and is not particularly limited.

First Embodiment

Figure 1A:
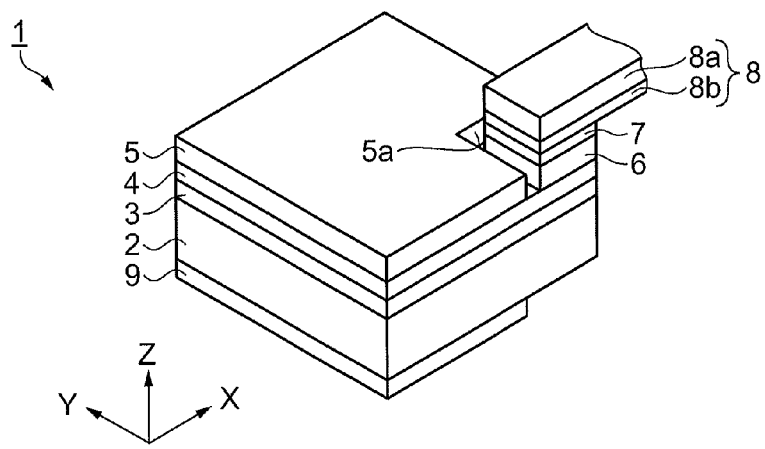
FIG. 1A is a schematic perspective view illustrating a structure of a solar cell according to a first embodiment.

A solar cell according to a first embodiment will be described with reference to FIG. 1A to FIG. 6C. FIG. 1A is a schematic perspective view illustrating a structure of a solar cell. As illustrated in FIG. 1A, a solar cell 1 includes a quadrangular substrate 2. The substrate 2 may be a plate member having conductivity, and as the substrate 2, various metal plates are able to be used. In this embodiment, for example, a stainless steel plate is used as the substrate 2. The stainless steel plate has excellent corrosion resistance, and thus is rarely oxidized in an environment used in a manufacturing process. A thickness direction of the substrate 2 is a Z direction, and directions in which two orthogonal sides of the substrate 2 extend are an X direction and a Y direction.

A power generating film 3, a transparent conductive film 4, and a first insulating film 5 are disposed on the surface of the substrate 2 on a +Z direction side in this order in an overlapping manner. The power generating film 3 is a film having an electromotive force which receives light and allows an electric current to flow. The transparent conductive film is a film having light transmissive properties and conductivity. The type of the transparent conductive film 4 is not particularly limited, and as the transparent conductive film 4, for example, IGO (Indium-Gallium Oxide), ITO (Indium Tin Oxide), and ICO (Indium-Cerium Oxide) are able to be used. In this embodiment, for example, ITO is adopted in the transparent conductive film 4. The first insulating film 5 is a film which protects and electrically insulates the transparent conductive film 4. The type of the first insulating film 5 is not particularly limited, and as the first insulating film 5, for example, a resin film of an acrylic resin or the like is able to be used.

The first insulating film 5 includes a cut-out portion 5a which is cut out such that a corner in the X direction and a −Y direction is in the shape of a quadrangle. Accordingly, in the cut-out portion 5a, the transparent conductive film 4 is exposed. Then, in the cut-out portion 5a, a conductive paste 6 and an anisotropic conductive film 7 are disposed on the transparent conductive film 4 in an overlapping manner, and a wiring member 8 is disposed on the anisotropic conductive film 7.

The conductive paste 6 is obtained by dispersing conductive particles in a resin material, and is used by solidifying the resin material. The material of the conductive particles of the conductive paste is not particularly limited, and as the material, carbon particles referred to as carbon black in addition to metal such as silver, and copper, and the like are able to be used. In this embodiment, for example, the carbon particles are used in the material of the conductive particles of the conductive paste. The carbon particles are easily available subject matters and are able to be easily obtained. Accordingly, it is possible to easily dispose the conductive paste.

The anisotropic conductive film 7 is an anisotropic conductive film. The anisotropic conductive film 7 is obtained by dispersing conductive particles in an adhesive material formed of a resin material, and is used by solidifying the resin material. The conductive particles of the anisotropic conductive film 7 are not particularly limited, and as the conductive particles, for example, a spherical body having a diameter of 3 μm to 5 μm in which a nickel layer, and a gold plated layer are stacked on a spherical body of a resin such as a polystyrene from the inner side is able to be used. In addition, metal particles are able to be used.

In the wiring member 8, a metal film 8b is disposed on a flexible substrate 8a, and the metal film 8b is connected to the anisotropic conductive film 7. The flexible substrate 8a is a film-like insulating body, and as the flexible substrate 8a, a polyimide film referred to as a coverlay or a photo-solder resist film, a polyethylene terephthalate resin (PET), and the like are able to be used. The metal film 8b is a metal foil such as a copper foil, and is adhered to the flexible substrate 8a. In addition, a conductive film which is obtained by solidifying a carbon paste, a silver paste, or the like is able to be used in the metal film 8b.

A second insulating film 9 is disposed on the surface of the substrate 2 on a −Z direction side. The second insulating film 9 is not particularly limited insofar as the second insulating film 9 has insulating properties, and as the second insulating film 9, a resin material is able to be used. In this embodiment, for example, a polyester film is used as the second insulating film 9.

The thickness of each member is not particularly limited, and in this embodiment, for example, each member has the following thickness. The thickness of the substrate 2 is 50 μm to 200 μm, and the thickness of the power generating film 3 is 300 nm to 700 nm. The thickness of the transparent conductive film 4 is 40 nm to 100 nm.

Figure 1B:
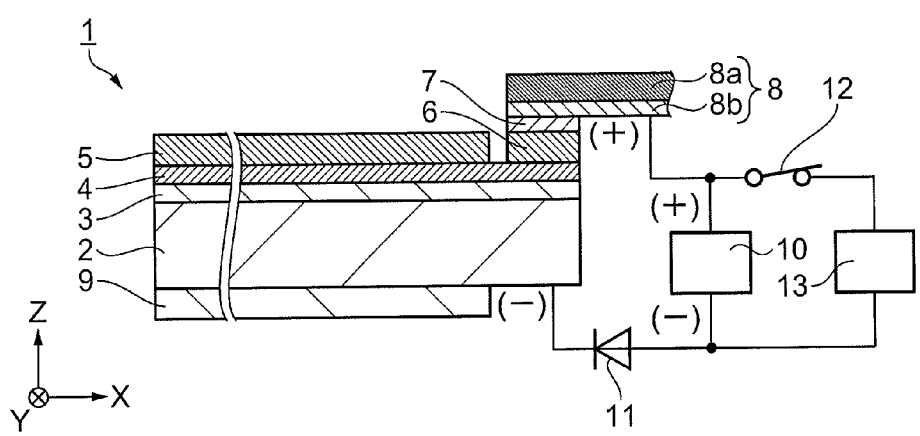
FIG. 1B is a circuit diagram of the solar cell according to the first embodiment.

FIG. 1B is a circuit diagram of the solar cell. As illustrated in FIG. 1B, in the solar cell 1, the wiring member 8 is a (+) electrode and the substrate 2 is a (−) electrode. The wiring member 8 is connected to a (+) electrode of a storage cell 10. The substrate 2 is connected to a (−) electrode of the storage cell 10 through a backward flow prevention diode 11. The backward flow prevention diode 11 is not particularly limited, and in this embodiment, as the backward flow prevention diode 11, for example, a schottky barrier diode is used.

The (+) electrode of the storage cell 10 is connected to a load circuit 13 through a switch 12, and the (−) electrode of the storage cell 10 is connected to the load circuit 13. The circuit is a circuit which energizes the load circuit 13 at the time of closing the switch 12.

Figure 1C:
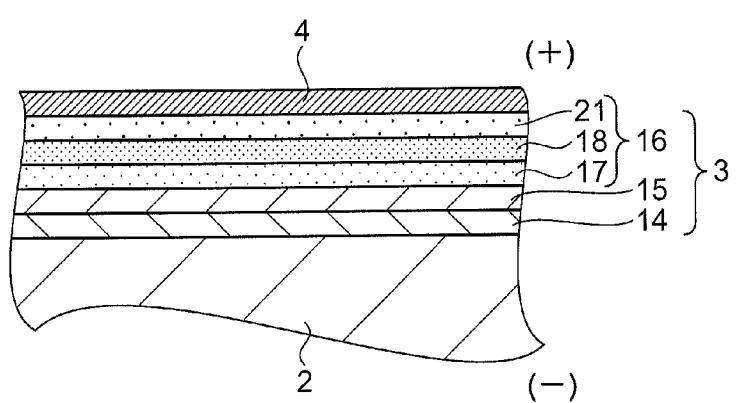
FIG. 1C is a schematic side view of main parts illustrating a structure of a power generating film according to the first embodiment.

FIG. 1C is a schematic side view of main parts illustrating a structure of the power generating film 3. As illustrated in FIG. 1C, the power generating film 3 has a structure in which an aluminum layer 14 (an Al layer), a zinc oxide layer 15 (a ZnO layer), and a semiconductor layer 16 are laminated in this order from the substrate 2 side. Light is incident on the solar cell 1 from the transparent conductive film 4 side (a +Z side). The transparent conductive film 4 functions as a positive electrode. The substrate 2 functions as a negative electrode.

Concavities and convexities are formed on the surface of the aluminum layer 14. The aluminum layer 14 is a layer on which light which has transmitted the semiconductor layer 16 and the zinc oxide layer 15 among the light incident from the transparent conductive film 4 side is scattered and reflected. The zinc oxide layer 15 is a layer of adjusting the refractive index of the light between the semiconductor layer 16 and the aluminum layer 14.

The semiconductor layer 16 is not particularly limited, and in this embodiment, the semiconductor layer 16, for example, is a multi-junction type power generating layer having a 3-layer structure. The structure is referred to as a triple junction structure. The semiconductor layer 16 has a structure in which a first amorphous silicon germanium layer 17, a second amorphous silicon germanium layer 18, and an amorphous silicon layer 21 are laminated in this order from the zinc oxide layer 15 side.

The first amorphous silicon germanium layer 17 and the second amorphous silicon germanium layer 18 are formed by doping amorphous silicon with germanium. The amount of germanium doped on the first amorphous silicon germanium layer 17 is different from the amount of germanium doped on the second amorphous silicon germanium layer 18. The doping amount of the first amorphous silicon germanium layer 17 is greater than the doping amount of the second amorphous silicon germanium layer 18. Each of the first amorphous silicon germanium layer 17, the second amorphous silicon germanium layer 18, and the amorphous silicon layer 21 is set to have a different absorption wavelength region.

Figure 2:
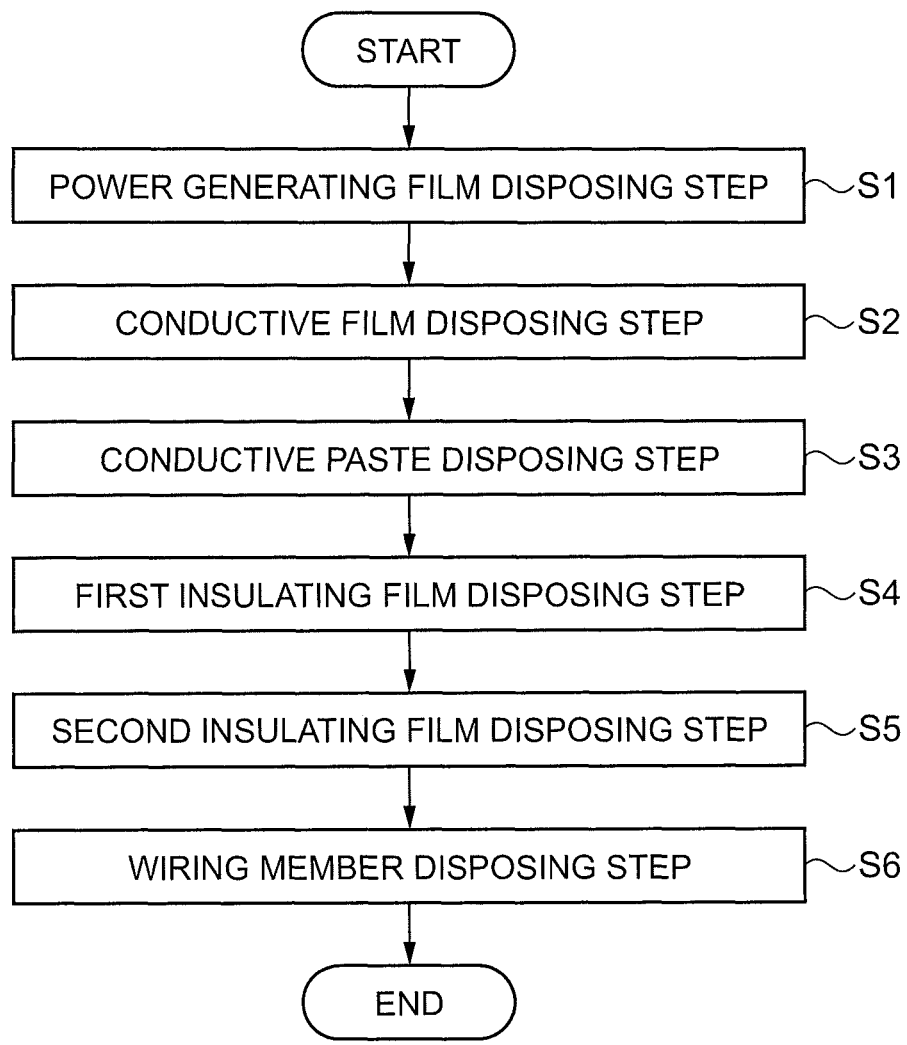
FIG. 2 is a flowchart of a manufacturing method of a solar cell.

Next, a manufacturing method of the solar cell 1 described above will be described with reference to FIG. 2 to FIG. 5B. FIG. 2 is a flowchart of a manufacturing method of a solar cell, and FIG. 3A to FIG. 5B are schematic views for illustrating the manufacturing method of a solar cell. In the flowchart of FIG. 2, Step S1 corresponds to a power generating film disposing step. This step is a step of disposing the power generating film 3 on the substrate 2. Next, the process proceeds to Step S2. Step S2 corresponds to a conductive film disposing step. This step is a step of disposing the transparent conductive film 4 on the power generating film 3. Next, the process proceeds to Step S3. Step S3 corresponds to a conductive paste disposing step. This step is a step of disposing the conductive paste on the transparent conductive film 4. Next, the process proceeds to Step S4.

Step S4 corresponds to a first insulating film disposing step. This step is a step of disposing the first insulating film 5 on the transparent conductive film 4. Next, the process proceeds to Step S5. Step S5 corresponds to a second insulating film disposing step. This step is a step of disposing the second insulating film 9 on the substrate 2.

Next, the process proceeds to Step S6. Step S6 corresponds to a wiring member disposing step. This step is a step of disposing the wiring member 8 in a position in which the conductive paste is disposed. The manufacturing process of the solar cell 1 ends through the steps described above.

Next, the manufacturing method will be described in detail with reference to FIG. 3A to FIG. 5B by being associated with the steps illustrated in FIG. 2.

Figure 3A:
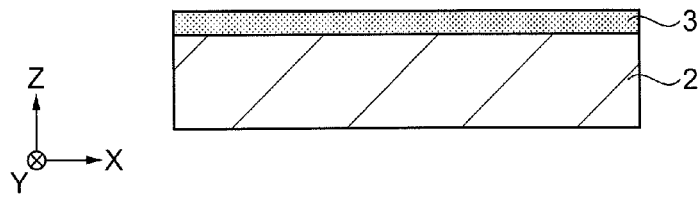
FIGS. 3A to 3D are schematic views for illustrating the manufacturing method of a solar cell.

FIG. 3A is a diagram corresponding to the power generating film disposing step of Step S1. As illustrated in FIG. 3A, the power generating film 3 is disposed on the substrate 2. First, the aluminum layer 14 is formed on the substrate 2 by using aluminum. Concavities and convexities are formed in the surface of the aluminum layer 14 by adjusting film forming conditions. Next, the zinc oxide layer 15 is formed on the aluminum layer 14.

Next, the first amorphous silicon germanium layer 17 doped with germanium is formed on the zinc oxide layer 15. Further, the second amorphous silicon germanium layer 18 doped with germanium is formed on the first amorphous silicon germanium layer 17. When the second amorphous silicon germanium layer 18 is formed, the doping amount of the germanium is reduced by the first amorphous silicon germanium layer 17.

Next, an amorphous silicon film is formed on the second amorphous silicon germanium layer 18, and becomes the amorphous silicon layer 21. According to this, the power generating film 3 is formed. The film of each layer is able to be manufactured by using a chemical vapor growth method or a deposition method, a physical vapor growth method such as a sputtering method, or the like.

Figure 3B:
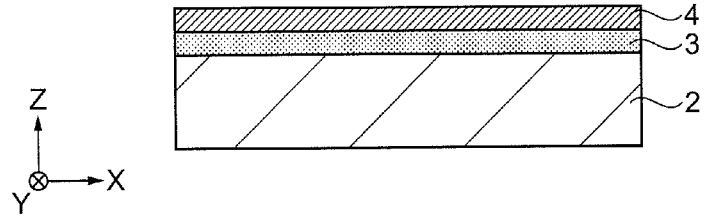

FIG. 3B is a diagram corresponding to the conductive film disposing step of Step S2. As illustrated in FIG. 3B, in Step S2, the transparent conductive film 4 is disposed on the power generating film 3. An ITO film is formed on the power generating film 3 in an overlapping manner. The ITO film is able to be manufactured by using a chemical vapor growth method or a deposition method, a physical vapor growth method such as a sputtering method, or the like.

Figure 3C:
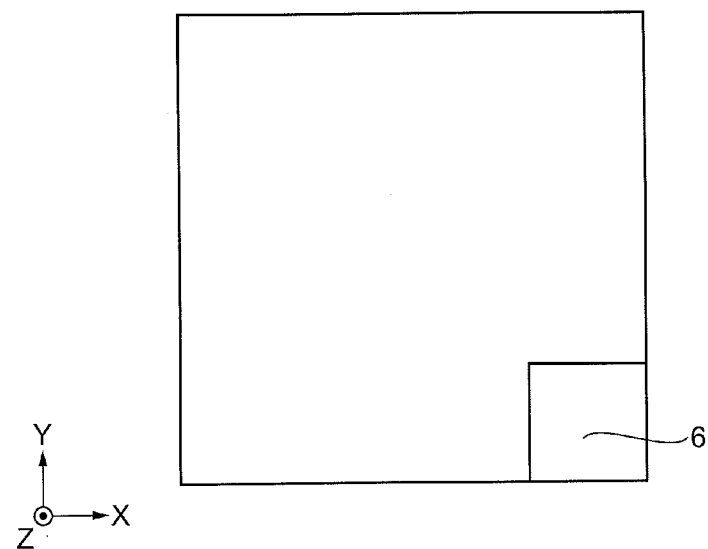
Figure 3D:
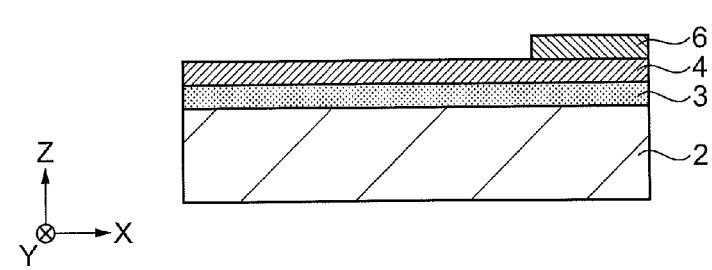

FIG. 3C and FIG. 3D are diagrams corresponding to the conductive paste disposing step of Step S3. As illustrated in FIG. 3C and FIG. 3D, in Step S3, the conductive paste 6 is disposed on the transparent conductive film 4. The conductive paste 6 is disposed in a position in which the conductive paste 6 is planned to be disposed. The conductive paste is able to be disposed by using various printing methods such as an offset printing method or a screen printing method. In this embodiment, for example, the conductive paste is disposed by using a screen printing method. The conductive paste 6 is disposed, and then is heated, and thus the conductive paste is solidified. The solidification, for example, is performed at 150° C. for approximately 30 minutes.

Figure 4A:
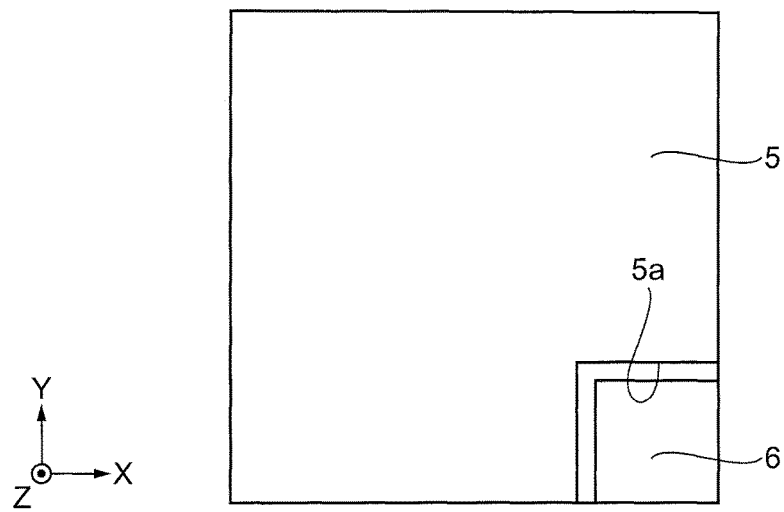
FIGS. 4A to 4D are schematic views for illustrating the manufacturing method of a solar cell.
Figure 4B:
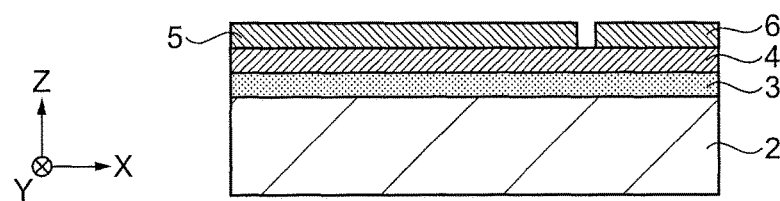

FIG. 4A and FIG. 4B are diagrams corresponding to the first insulating film disposing step of Step S4. As illustrated in FIG. 4A and FIG. 4B, in Step S4, the first insulating film 5 is disposed on the transparent conductive film 4. A resin material which is the material of the first insulating film 5 is disposed by using various printing methods such as an offset printing method or a screen printing method. In this embodiment, for example, the material of the first insulating film 5 is disposed by using a screen printing method. Next, the material of the first insulating film 5 is heated and solidified. The first insulating film 5 is disposed into the shape having the cut-out portion 5a. The solidification, for example, is performed at 150° C. for approximately 30 minutes. Accordingly, the first insulating film 5 is disposed such that the conductive paste 6 is exposed.

Figure 4C:
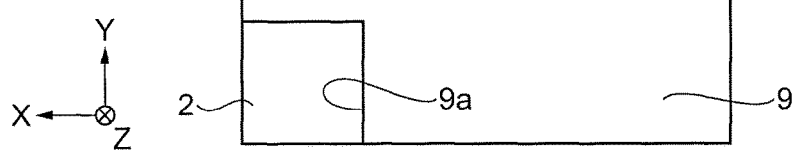
Figure 4D:
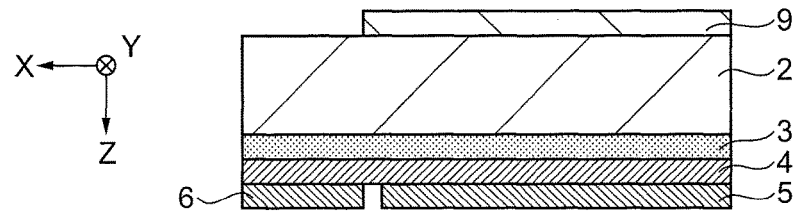

FIG. 4C and FIG. 4D are diagrams corresponding to the second insulating film disposing step of Step S5. As illustrated in FIG. 4C and FIG. 4D, in Step S5, the second insulating film 9 is disposed on the substrate 2. The second insulating film 9 is a polyester film onto which an adhesive material is applied. The substrate 2 is positioned and attached with respect to the second insulating film 9. After the attachment, the second insulating film 9 and the substrate 2 are pressed and are reliably adhered to each other.

In the second insulating film 9, a position facing the cut-out portion 5a of the first insulating film 5 is a cut-out portion 9a. Accordingly, the substrate 2 is exposed, and thus it is possible to connect a terminal or the like to the substrate 2.

Figure 5A:
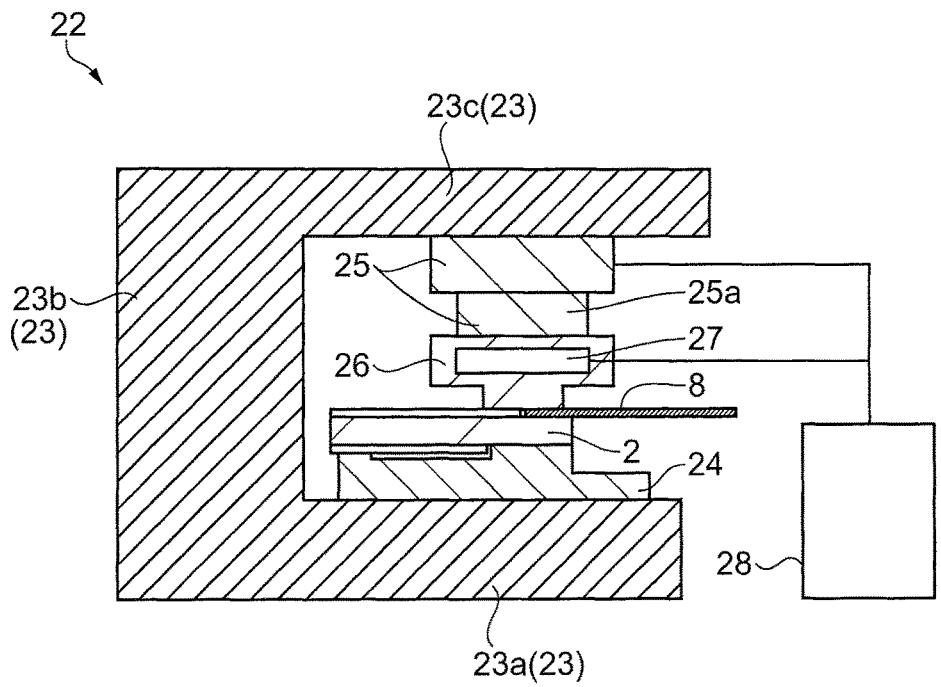
FIGS. 5A and 5B are schematic views for illustrating the manufacturing method of a solar cell.
Figure 5B:
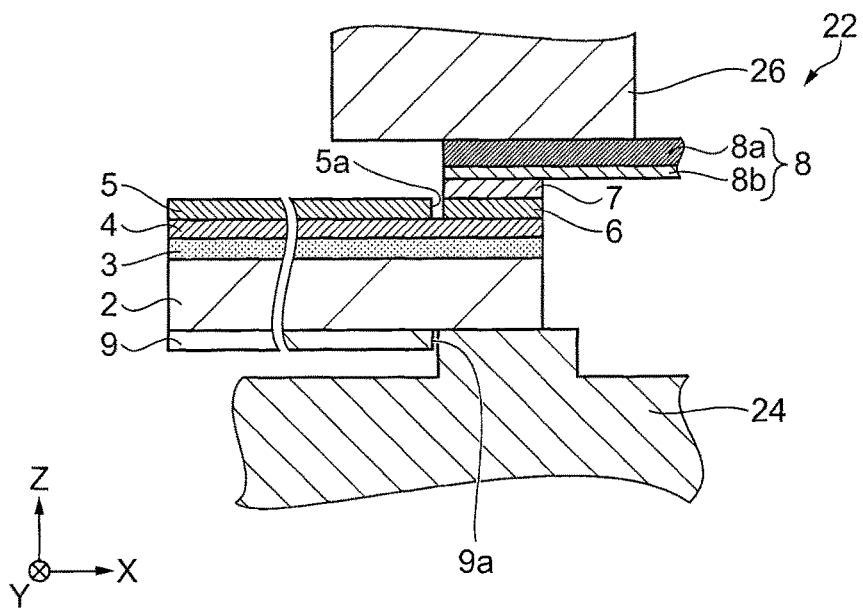

FIGS. 5A and 5B are diagrams corresponding to the wiring member disposing step of Step S6, and FIG. 5A is a schematic view when a pressing and heating device 22 is seen from a side surface side by which the wiring member 8 is pressed to the conductive paste 6 and is heated. As illustrated in FIG. 5A, the pressing and heating device 22 includes a base 23 . The base 23 includes a bed sill 23a disposed on the bottom, and a post portion 23b erected from the bed sill 23a. Further, a beam portion 23c protrudes from the post portion 23b parallel to the bed sill 23a.

A stand 24 is disposed on the bed sill 23a, and the substrate 2 which has been subjected to processing until Step S5 is mounted on the stand 24. The wiring member 8 is temporarily joined to the substrate 2. A pressing device 25 is disposed on the beam portion 23c on the bed sill 23a side.

The pressing device 25 includes a hydraulic cylinder therein, and the hydraulic cylinder lifts and lowers a movable portion 25a. A pressing unit 26 is disposed on the movable portion 25a on the bed sill 23a side, the pressing unit 26 includes a heating device 27 therein, and the heating device 27 heats the pressing unit 26. The heating device 27 includes an electrically resistive element or the like, and is able to perform heating by energizing the resistive element. The pressing device 25 and the heating device 27 are connected to a control device 28.

A load sensor and a temperature sensor are disposed on the pressing unit 26, and each sensor is connected to the control device 28. The control device 28 controls the lifting and lowering, and the heating of the pressing unit 26. The control device 28 controls a portion which is exposed by the cut-out portion 9a of the substrate 2 and a load for pressing the wiring member 8 by using an output of the load sensor. Further, the control device 28 controls the temperature of the pressing unit 26 by using an output of the temperature sensor.

As illustrated in FIG. 5B, the wiring member 8 which has been temporarily joined to the substrate 2 is detached from the substrate 2, and then the material of the anisotropic conductive film 7 is disposed on the wiring member 8 on the metal film 8b side. The material of the anisotropic conductive film 7 is a material which is obtained by dispersing conductive particles in an adhesive material. A disposing method of the material of the anisotropic conductive film 7 is not particularly limited, and is able to be disposed by various printing methods such as an offset printing method or a screen printing method.

The portion which is exposed by the cut-out portion 9a of the substrate 2 is disposed to be positioned in a convex portion of the stand 24, and the wiring member 8 is disposed such that the anisotropic conductive film 7 overlaps with the conductive paste 6.

Next, the pressing unit 26 is lowered, and thus the substrate 2 and the wiring member 8 are interposed between the stand 24 and the pressing unit 26. At this time, the power generating film 3, the transparent conductive film 4, the conductive paste 6, and the anisotropic conductive film 7 are interposed between the substrate 2 and the wiring member 8. Then, the pressing and heating device 22 presses the substrate 2 and the wiring member 8. Next, the pressing and heating device 22 heats the pressing unit 26. Accordingly, the conductive paste 6 and the anisotropic conductive film 7 are cured, and the wiring member 8 is adhered and fixed to the transparent conductive film 4.

That is, the conductive paste 6 is disposed on the transparent conductive film 4. Further, the wiring member 8 is disposed on the conductive paste 6 through the anisotropic conductive film 7. Next, the pressing and heating device 22 presses the substrate 2 and the wiring member 8 by interposing them. Then, the adhesive material included in the anisotropic conductive film 7 is heated while being pressed, and thus the wiring member 8 is fixed. The pressing conditions and the heating conditions are not particularly limited, and in this embodiment, for example, the pressing is performed at approximately 3 ×10⁶ Pascal, and the heating is performed at approximately 150° C.

In a method of adhering the transparent conductive film 4 and the wiring member 8 by only using the conductive paste 6, the conductive paste 6 spreads due to the pressurization. Accordingly, the conductive paste 6 protrudes from the wiring member 8, and thus manufacturing is not easily performed. In a method of disposing the conductive paste 6 and the anisotropic conductive film 7 between the transparent conductive film 4 and the wiring member 8, first, the conductive paste 6 is solidified without being pressed. Next, the anisotropic conductive film 7 is adhered to the solidified conductive paste 6. Accordingly, the conductive paste 6 rarely spreads, and thus it is possible to easily adhere the transparent conductive film 4 to the wiring member 8.

The power generating film 3 is a semiconductor film having a photovoltaic effect and is a film which is easily damaged by pressurization. Then, the damaged power generating film 3 has low pressure resistance with respect to an electric voltage. Then, an electric current is leaked at a position which is damaged at the time of applying the electric voltage by static electricity, and thus insulation is broken. In this embodiment, the transparent conductive film 4, the conductive paste 6, and the anisotropic conductive film 7 are arranged between the power generating film 3 and the wiring member 8. In the anisotropic conductive film 7, resin spherical bodies are dispersed in an adhesive material.

When the conductive paste 6 is not disposed, a load which is transmitted from the wiring member 8 to the transparent conductive film 4 through the anisotropic conductive film 7 is mainly transmitted to the transparent conductive film 4 through the resin spherical bodies included in the anisotropic conductive film 7. Accordingly, the stress is concentrated on a position where the resin spherical bodies exist.

In contrast, when the conductive paste 6 is disposed, and the substrate 2 and the wiring member 8 are pressed by being interposed, the distribution of the stress applied to the power generating film 3 is averaged by the conductive paste 6 . Then, the stress is prevented from being biased to the resin spherical bodies included in the anisotropic conductive film 7. Accordingly, the stress is not concentrated on a specific position of the power generating film 3, and thus the power generating film 3 is prevented from being damaged. As a result thereof, it is possible to improve the electrostatic resistance of the solar cell 1.

It is preferable that the thickness of the conductive paste 6 is greater than or equal to 5 μm. When the thickness of the conductive paste 6 is greater than or equal to 5 μm, the distribution of the stress applied to the power generating film 3 at the time of pressing the substrate 2 and the wiring member 8 by interposing them is reliably averaged by the conductive paste 6. Then, it is possible to prevent the stress from being biased to a specific position. It is preferable that the thickness of the conductive paste 6 is less than or equal to 3 mm. When the thickness of the conductive paste 6 is greater than or equal to 3 mm, the conductive paste 6 is easily deformed in a step before being solidified, and thus it is difficult to dispose the wiring member 8 on the conductive paste 6 with high positioning accuracy.

Figure 6A:
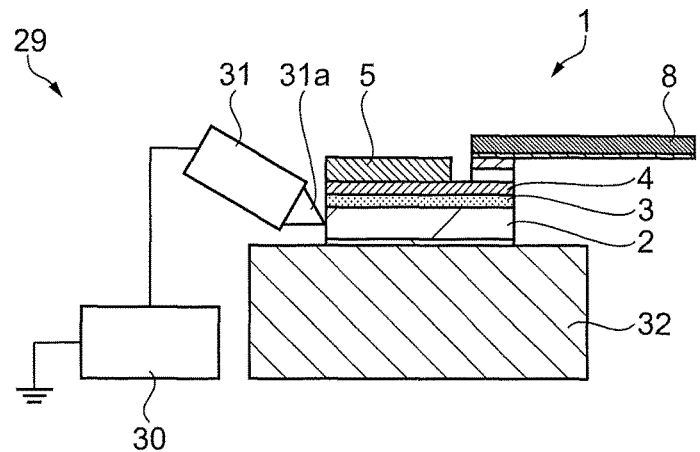
FIGS. 6A and 6B are schematic views for illustrating a method of a static electricity test.
Figure 6B:
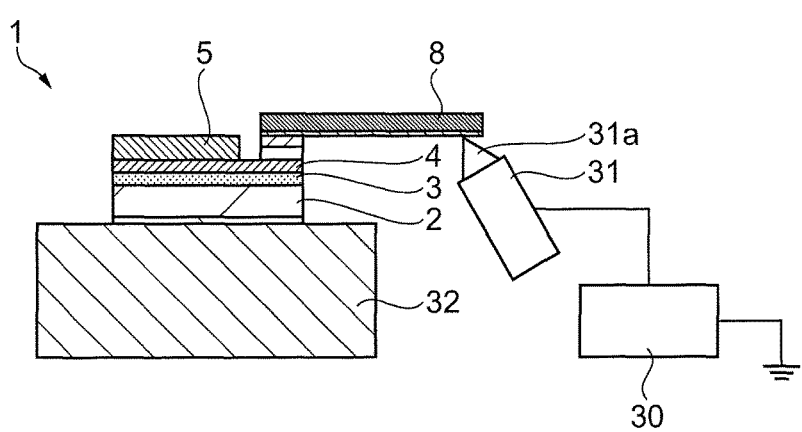
Figure 6C:
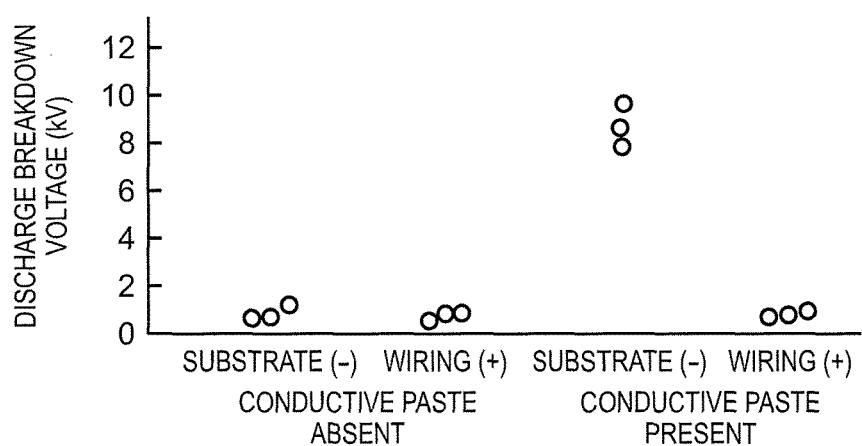
FIG. 6C is a diagram for illustrating a result of the static electricity test.

FIG. 6A and FIG. 6B are schematic views for illustrating a method of a static electricity test, and FIG. 6C is a diagram for illustrating a result of the static electricity test. First, a test of applying static electricity having a (−) polarity to the substrate 2 will be described. As illustrated in FIG. 6A, a static electricity test device 29 includes a high voltage power supply 30, a discharge probe 31, and a mounting table 32. The high voltage power supply 30 is a device which generates static electricity and supplies the static electricity to the discharge probe 31. The mounting table 32 is a table for mounting a specimen thereon, and has a structure having high insulating properties. The discharge probe 31 includes a conductive applying unit 31a, and thus the static electricity is discharged from the applying unit 31a to the specimen.

An operator mounts the solar cell 1 on the mounting table 32. Next, the solar cell 1 is fixed to the mounting table 32 by using a fixing tool (not illustrated) . In the fixing tool, for example, a clamping mechanism is able to be used. Next, the operator brings the applying unit 31a in contact with the substrate 2. Subsequently, the operator drives the static electricity test device 29, and applies a high electric voltage having a (−) polarity to the substrate 2. The power generating film 3 has a diode structure, and thus it is found that when the substrate 2 is a (−) electrode, the power generating film 3 is easily damaged, and when the substrate 2 is a (+) electrode, the power generating film 3 is rarely damaged. An electric voltage at which the solar cell 1 is broken is measured by applying the electric voltage of the static electricity from a low electric voltage and by sequentially increasing the electric voltage. After the electric voltage to be applied is set, the electric voltage is applied 10 times, and it is confirmed whether the solar cell 1 is broken or normal. The examination of the solar cell 1 is determined by measuring a characteristic curve of an electric voltage and an electric current. When the power generating film 3 is broken, the electric voltage does not increase, even though light is received, and thus the determination is able to be easily performed.

Next, a test of applying static electricity having a (+) polarity to the wiring member 8 will be described. As illustrated in FIG. 6B, the operator mounts the solar cell 1 on the mounting table 32. Next, the solar cell 1 is fixed to the mounting table 32 by using the fixing tool (not illustrated). Next, the operator brings the applying unit 31a in contact with the metal film 8b of the wiring member 8. Subsequently, the operator drives the static electricity test device 29 and applies a high electric voltage having a (+) polarity to the wiring member 8. The power generating film 3 has a diode structure, and thus it is found that when the wiring member 8 is a (+) electrode, the power generating film 3 is easily damaged, and when the wiring member 8 is a (−) electrode, the power generating film 3 is rarely damaged. An electric voltage at which the solar cell 1 is broken is measured by applying the electric voltage of the static electricity from a low electric voltage and by sequentially increasing the electric voltage. After the electric voltage to be applied is set, the electric voltage is applied 10 times, and it is confirmed whether the solar cell 1 is broken or normal.

Subsequently, the result of the static electricity test will be described. In FIG. 6C, "Conductive Paste Absent" on a horizontal axis indicates a structure in which the anisotropic conductive film 7 is connected to the transparent conductive film 4, and the conductive paste 6 is not disposed.

The "Conductive Paste Present" indicates a structure in which the conductive paste 6 is disposed between the transparent conductive film 4 and the anisotropic conductive film 7. "Substrate (−)" indicates that a high electric voltage having a (−) polarity is applied to the substrate 2. "Wiring (+)" indicates that a high electric voltage having a (+) polarity is applied to the metal film 8b of the wiring member 8.

A discharge break electric voltage on the vertical axis indicates an electric voltage when the solar cell 1 is broken. In "Substrate (−)" of "Conductive Paste Absent", the discharge break electric voltages are 0.6 kV, 0.8 kV, and 1.8 kV, and an average value is 0.73 kV. In contrast, In "Substrate (−)" of "Conductive Paste Present", the discharge break electric voltages are 8 kV, 9 kV, and 10 kV, and an average value is 9 kV. Accordingly, it is possible to improve the electrostatic resistance of the solar cell 1 with respect to the static electricity from the substrate 2 by disposing the conductive paste 6.

In "Wiring (+)" of "Conductive Paste Absent", the discharge break electric voltages are 0.4 kV, 0.6 kV, and 0.6 kV, and an average value is 0.53 kV. In contrast, in "Wiring (+)" of "Conductive Paste Present", the discharge break electric voltages are 0.6 kV, 0.8 kV, and 1 kV, and an average value is 0.8 kV. Accordingly, it is possible to improve the electrostatic resistance of the solar cell 1 with respect to the static electricity from the wiring member 8 by disposing the conductive paste 6.

As described above, according to this embodiment, the following effects are obtained.

(1) According to this embodiment, it is possible to improve the electrostatic resistance of the solar cell 1 with respect to the static electricity from the substrate 2 by disposing the conductive paste 6.

(2) According to this embodiment, the thickness of the conductive paste 6 is greater than or equal to 5 μm. When the thickness of the conductive paste 6 is greater than or equal to 5 μm, the distribution of the stress applied to the power generating film 3 at the time of pressing the substrate 2 and the wiring member 8 by interposing them is reliably averaged by the conductive paste 6. Then, it is possible to prevent the stress from being biased to a specific position.

(3) According to this embodiment, the conductive paste 6 includes the carbon particles. The carbon particles are easily available subject matter and are able to be easily obtained. Accordingly, it is possible to easily dispose the conductive paste 6.

Second Embodiment

Next, one embodiment of a solar cell will be described with reference to a schematic side view illustrating a structure of a solar cell of FIG. 7. This embodiment is different from the first embodiment in that the solar cell includes a plurality of substrates 2. Furthermore, the description of the same parts as those of the first embodiment will be omitted.

Figure 7:
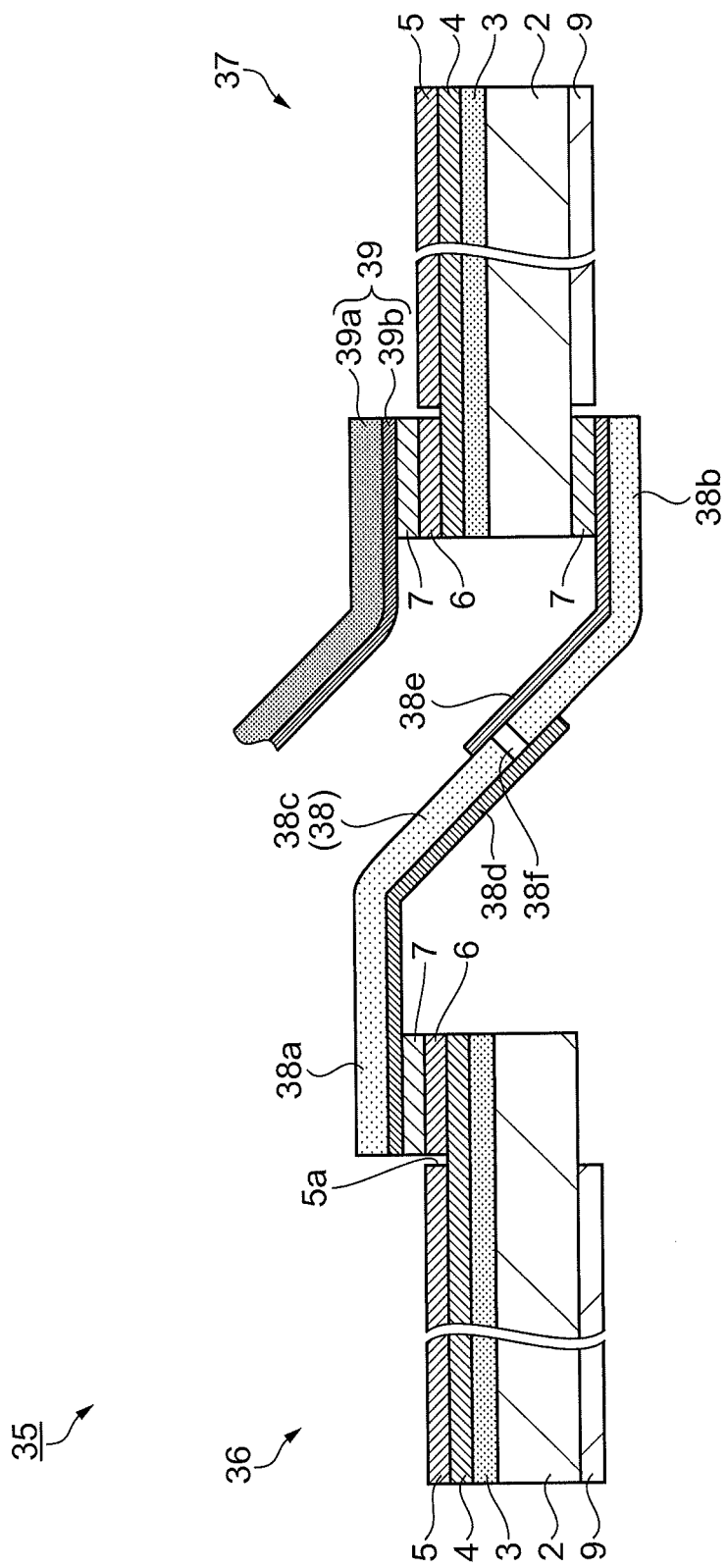
FIG. 7 is a schematic side view illustrating a structure of a solar cell according to a second embodiment.

That is, in this embodiment, as illustrated in FIG. 7, a solar cell 35 includes a first cell unit 36 and a second cell unit 37. The first cell unit 36 and the second cell unit 37 are connected by a first wiring member 38 as the wiring member. The first cell unit 36 and the second cell unit 37 have the same structure as that of the solar cell 1 of the first embodiment. That is, the power generating film 3, the transparent conductive film 4, and the first insulating film are disposed on one surface of the substrate 2 in an overlapping manner. The second insulating film 9 is disposed on the other surface of the substrate 2.

In the first wiring member 38, an end portion which is connected to the first cell unit 36 is a first end portion 38a, and an end portion which is connected to the second cell unit 37 is a second end portion 38b. The first wiring member 38 includes a flexible substrate 38c, a first metal film 38d is disposed on one surface of the flexible substrate 38c, and a second metal film 38e is disposed on the other surface. The first metal film 38d and the second metal film 38e are connected by a through electrode 38f passing through the flexible substrate 38c.

In the first end portion 38a, the conductive paste 6, and the anisotropic conductive film 7 are laminated on the transparent conductive film 4, and the anisotropic conductive film 7 is connected to the first metal film 38d of the first wiring member 38. The conductive paste 6 is disposed between the transparent conductive film 4 and the anisotropic conductive film 7, and thus the power generating film 3 is rarely damaged.

In the second end portion 38b, the substrate 2 and the second metal film 38e are connected through the anisotropic conductive film 7. Accordingly, the transparent conductive film 4 of the first cell unit 36 and the substrate 2 of the second cell unit 37 are connected. Accordingly, the first cell unit 36 and the second cell unit 37 are connected in series.

In the second cell unit 37, the conductive paste 6, and the anisotropic conductive film 7 are laminated on the transparent conductive film 4, and the anisotropic conductive film 7 and a second wiring member 39 as the wiring member are connected. In the second wiring member 39, a metal film 39b is disposed on one surface of a flexible substrate 39a, and the metal film 39b is connected to the anisotropic conductive film 7. The conductive paste 6 is disposed between the transparent conductive film 4 and the anisotropic conductive film 7, and thus the power generating film 3 is rarely damaged.

However, static electricity is moved from the substrate 2 of the second cell unit 37 to the substrate 2 of the first cell unit 36 through the first wiring member 38. At this time, even when the conductive paste 6 is disposed on the first cell unit 36, resistance with respect to the static electricity is not changed.

As described above, according to this embodiment, the following effects are obtained.

(1) According to this embodiment, the solar cell 35 includes two substrates 2 in which the first wiring member 38 is fixed to the transparent conductive film 4. The respective substrates 2 are connected in series, and thus it is possible to increase an output electric voltage. Then, in the first cell unit 36, the first wiring member 38 is fixed to the transparent conductive film 4 by interposing the conductive paste 6 and the anisotropic conductive film 7 in the substrate 2. In the second cell unit 37, the second wiring member 39 is fixed to the transparent conductive film 4 by interposing the conductive paste 6 and the anisotropic conductive film 7. Accordingly, in both of the substrates 2, the power generating film 3 is prevented from being damaged. As a result thereof, it is possible to improve electrostatic resistance with respect to the static electricity which is moved from the substrate 2 of the first cell unit 36 to the substrate 2 of the second cell unit 37.

Third Embodiment

Figure 8A:
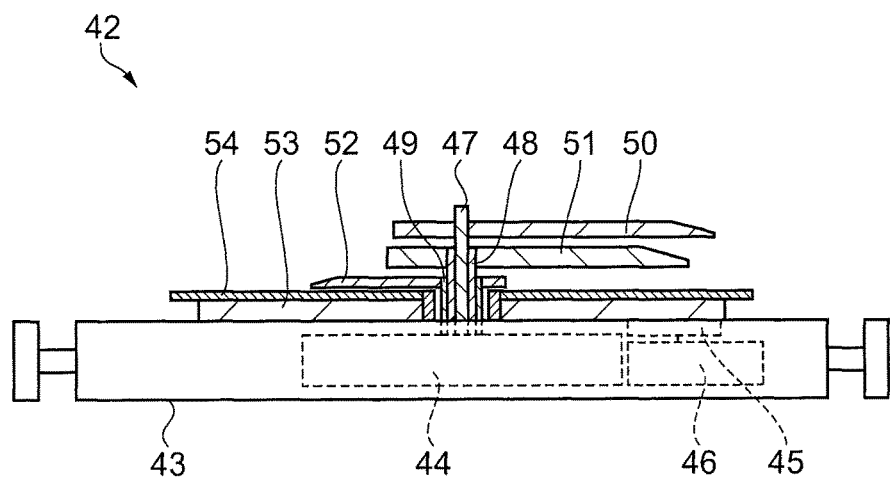
FIG. 8A is a schematic side view illustrating a structure of a timepiece according to a third embodiment.
Figure 8B:
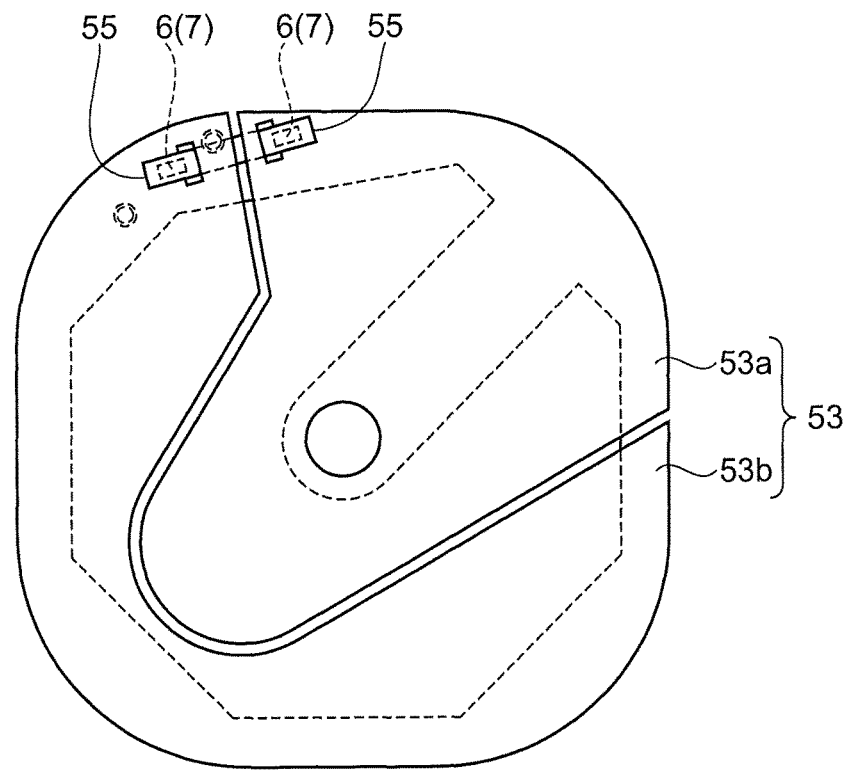
FIG. 8B is a schematic plan view illustrating a structure of a solar cell according to the third embodiment.

Next, one embodiment of a solar cell will be described with reference to a schematic side view illustrating a structure of a timepiece of FIG. 8A and a schematic plan view illustrating a structure of a solar cell of FIG. 8B. FIG. 8A and FIG. 8B are diagrams in which the outer package of the timepiece is not illustrated. The timepiece of this embodiment includes a solar cell having the same structure as that of the first embodiment and the second embodiment. Furthermore, the description of the same parts as those of the first embodiment and the second embodiment will be omitted.

That is, in this embodiment, as illustrated in FIGS. 8A and 8B, a timepiece 42 as an electronic device includes a movement 43, and a train wheel 44, a driving circuit 45, a power supply unit 46, and the like are disposed on the movement 43. The movement 43 indicates a portion excluding the outer package, hands, and the like in the timepiece 42. The train wheel 44 is configured of a plurality of gears, and each of the gears is rotated at different number of rotations. A second hand shaft 47, a minute hand shaft 48, and an hour hand shaft 49 protrude from the train wheel 44. A second hand 50 is disposed on the second hand shaft 47, and a minute hand 51 is disposed on the minute hand shaft 48. An hour hand 52 is disposed on the hour hand shaft 49.

A solar cell 53 and a dial plate 54 are disposed on the movement 43 on the hour hand 52 side of the movement 43 in an overlapping manner. A graduation showing hours, minutes, and seconds is disposed on the dial plate 54. The dial plate 54 is configured of a light transmissive material, and the solar cell 53 is irradiated with light with which the timepiece 42 is irradiated. Then, the solar cell 53 receives the light and generates power. The solar cell 53 is connected to the driving circuit 45 by wiring (not illustrated).

The electric power generated by the solar cell 53 passes through the driving circuit 45 and energizes the power supply unit 46. The power supply unit 46 includes a capacitor, and the power supply unit 46 accumulates the electric power generated by the solar cell 53. A motor (not illustrated) is disposed on the driving circuit 45, and the driving circuit 45 drives the motor. At this time, the driving circuit 45 uses the electric power accumulated in the power supply unit 46. The gear in the train wheel 44 is rotated by the motor, and the second hand shaft 47, the minute hand shaft 48, and the hour hand shaft 49 are rotated. As a result thereof, the second hand 50, the minute hand 51, and the hour hand 52 are rotated.

As illustrated in FIG. 8B, the solar cell 53 includes a first solar cell 53a and a second solar cell 53b, and the first solar cell 53a and the second solar cell 53b are connected in series by a wiring member 55. The transparent conductive film 4 is disposed on the first solar cell 53a on the dial plate side, and the conductive paste 6 and the anisotropic conductive film 7 are disposed on the transparent conductive film 4 in an overlapping manner. Then, the wiring member 55 is disposed on the anisotropic conductive film 7. Similarly, the transparent conductive film 4 is disposed on the second solar cell 53b on the dial plate 54 side, and the conductive paste 6 and the anisotropic conductive film 7 are disposed on the transparent conductive film 4 in an overlapping manner. Then, the wiring member 55 is disposed on the anisotropic conductive film 7.

Accordingly, as with the first embodiment and the second embodiment, when the wiring member 55 is disposed on and fixed to the transparent conductive film 4, the power generating film 3 is prevented from being damaged. As a result thereof, the solar cell 53 is a solar cell of which the electrostatic resistance is improved. Accordingly, the timepiece 42 may be an electronic device including the solar cell of which the electrostatic resistance is improved.

Furthermore, this embodiment is not limited to the embodiments described above, and is able to be variously modified or improved by a person with ordinary skill in the art within the technical ideas of the invention. Modification examples are as follows.

MODIFICATION EXAMPLE 1

In the first embodiment, one solar cell 1 is manufactured from two substrates 2. A plurality of solar cells 1 may be manufactured from a large-size substrate. After the conductive film disposing step of Step S2, the large-size substrate, the power generating film 3, and the transparent conductive film 4 are patterned into a predetermined shape. Then, after the wiring member disposing step of Step S6, the large-size substrate may be divided into various solar cells 1.

MODIFICATION EXAMPLE 2

In the first embodiment, the solar cell 1 includes the first insulating film 5 and the second insulating film 9. When a position through which the electric current flows is limited such as a case where the solar cell 1 is contained in an insulating container, the first insulating film 5 and the second insulating film 9 may be omitted. It is possible to omit the steps of disposing the films, and thus the manufacturing is performed with high productivity.

MODIFICATION EXAMPLE 3

In the second embodiment, the first cell unit 36 and the second cell unit 37 are connected in series by the first wiring member 38. The first cell unit 36 and the second cell unit 37 may be connected in parallel. At this time, it is possible to increase an output electric current. At this time, the electrostatic resistance of the solar cell is able to be improved by disposing the conductive paste 6 and the anisotropic conductive film 7 between the transparent conductive film 4 and the wiring member.

MODIFICATION EXAMPLE 4

In the second embodiment, the first cell unit 36 and the second cell unit 37 are connected by the first wiring member 38. The number of cell units to be connected may be greater than or equal to 3. When the cell units are connected in series, an electric voltage is able to be higher as the number of cell units increases. When the cell units are connected in parallel, the cell unit is able to be various shapes.

MODIFICATION EXAMPLE 5

In the third embodiment, an example of the timepiece 42 including the solar cell 53 is described. In all electronic devices including the solar cell 53, the conductive paste 6 and the anisotropic conductive film 7 are able to be disposed between the transparent conductive film 4 and the wiring member. As a result thereof, the electrostatic resistance of the electronic device is able to be improved. For example, the structure described above is able to be applied to the electronic device including the solar cell such as a mobile phone, Pedometer™, a radio, a television, a digital camera, a camcorder, and a temperature indicator.

What is claimed is:

1. A manufacturing method of a solar cell, comprising:
    disposing a semiconductor film having a photoelectric conversion function between a substrate having conductivity and a transparent conductive film;
    disposing a conductive paste on the transparent conductive film;
    disposing a wiring member on the conductive paste through an anisotropic conductive film; and
    disposing an insulating film on the transparent conducting film, wherein
    the disposing of the wiring member comprises disposing the anisotropic conductive film between the substrate and the wiring member, and heating the anisotropic conductive film while pressing the anisotropic conductive film from both sides of the substrate and the wiring member,
    the disposing of the insulating film on the transparent conducting film comprises creating a cut-out portion in the insulating film at a corner of the solar cell that exposes a portion of the transparent conductive film, and
    the conductive paste and the anisotropic conductive film are disposed in the cut-out portion.

2. The manufacturing method of a solar cell according to claim 1,
    wherein a thickness of the conductive paste is greater than or equal to 5 µm.

3. The manufacturing method of a solar cell according to claim 1,
    wherein the conductive paste comprises carbon particles.

4. A solar cell, comprising:
    a substrate having conductivity;
    a semiconductor film having a photoelectric conversion function which is disposed on the substrate;
    a transparent conductive film which is disposed on the semiconductor film;
    an insulating film disposed on the transparent conducting film, the insulating film comprising a cut-out portion that exposes a portion of the transparent conductive film, the cut-out portion being disposed at a corner of the solar cell; and
    a wiring member which is electrically connected to the transparent conductive film,
    wherein the transparent conductive film and the wiring member are fixed by interposing a conductive paste and an anisotropic conductive film, and
    the conductive paste and the anisotropic conductive film are disposed in the cut-out portion.

5. The solar cell according to claim 4,
    wherein a thickness of the conductive paste is greater than or equal to 5 µm.

6. The solar cell according to claim 4,
    wherein the conductive paste comprises carbon particles.

7. A solar cell, comprising:
    a first solar cell;
    a second solar cell; and
    a wiring member which is electrically connected to the first solar cell and the second solar cell, wherein
    each of the first solar cell and the second solar cell comprises a substrate having conductivity, a transparent conductive film, and a semiconductor film having a photoelectric conversion function that is disposed between the substrate and the transparent conductive film,
    the wiring member is fixed to the transparent conductive film of the first solar cell through a conductive paste and a first anisotropic conductive film, and is fixed to the substrate of the second solar cell through a second anisotropic conductive film,
    at least the first solar cell further comprises an insulating film disposed on the transparent conducting film, the insulating film comprising a cut-out portion disposed at a corner of the first solar cell, and the cut-out portion exposes a portion of the transparent conductive film of the first solar cell, and
    the conductive paste and the first anisotropic conductive film are disposed in the cut-out portion.

8. An electronic device comprising a solar cell,
    wherein the solar cell is the solar cell according to claim 4.

9. The electronic device according to claim 8,
    wherein the electronic device is a timepiece.

10. An electronic device comprising a solar cell,
    wherein the solar cell is the solar cell according to claim 7.

11. The electronic device according to claim 10,
    wherein the electronic device is a timepiece.

12. The manufacturing method of a solar cell according to claim 1,
    wherein the insulating film and the conductive paste extend in a same plane that is parallel to the transparent conductive film.

13. The solar cell according to claim 4,
wherein the insulating film and the conductive paste extend in a same plane that is parallel to the transparent conductive film.

14. The solar cell according to claim 7,
wherein, in the first solar cell that comprises the insulating film, the insulating film and the conductive paste extend in a same plane that is parallel to the transparent conductive film.

* * * * *